(12) United States Patent  
Duffar et al.

(10) Patent No.: US 7,465,355 B2  
(45) Date of Patent: Dec. 16, 2008

(54) METHOD AND DEVICE FOR PRODUCTING MONOCRYSTALS

(75) Inventors: Thierry Duffar, Grenoble (FR); Annie Fournier-Gagnoud, Grenoble (FR)

(73) Assignee: Centre National de la Recherche Scientifique, Paris Cedex (FR)

( * ) Notice: Subject to any disclaimer, the term of this patent is extended or adjusted under 35 U.S.C. 154(b) by 0 days.

(21) Appl. No.: 10/587,368

(22) PCT Filed: Jan. 28, 2005

(86) PCT No.: PCT/US2005/050055

§ 371 (c)(1),  
(2), (4) Date: May 7, 2007

(87) PCT Pub. No.: WO2005/078166

PCT Pub. Date: Aug. 25, 2005

(65) Prior Publication Data

US 2007/0277729 A1    Dec. 6, 2007

(30) Foreign Application Priority Data

Jan. 30, 2004    (FR) ................................... 0450177

(51) Int. Cl.  
*C30B 35/00* (2006.01)  
*C30B 11/02* (2006.01)

(52) U.S. Cl. ......................... 117/221; 117/81; 117/83; 117/219

(58) Field of Classification Search .................. 117/81, 117/83, 219, 221  
See application file for complete search history.

(56) References Cited

U.S. PATENT DOCUMENTS

| 3,096,158 | A | 7/1963 | Gaule et al. |
| 6,554,895 | B2 * | 4/2003 | Duffar et al. .................. 117/82 |
| 2002/0121237 | A1 | 9/2002 | Glavish et al. |

FOREIGN PATENT DOCUMENTS

| EP | 1167586 | 1/2002 |
| FR | 2757184 | 6/1998 |
| FR | 2806100 | 9/2001 |
| JP | 59021583 | 2/1984 |
| JP | 06234590 | 8/1994 |

OTHER PUBLICATIONS

International Search Report dated Jun. 23, 2005 (3 pgs).

* cited by examiner

*Primary Examiner*—Felisa C Hiteshew  
(74) *Attorney, Agent, or Firm*—Howard IP Law Group, PC

(57) ABSTRACT

A device for manufacturing a single-crystal solid phase by solidification of a liquid phase, comprising: a crucible capable of containing the solid phase and the liquid phase, the liquid phase being in contact with the crucible and the solid phase being separated from the crucible by an interstice; and a heating mechanism for heating the liquid phase capable of creating a thermal gradient at the level of an interface between the liquid phase and the solid phase, electromagnetic field generation, distinct from the heating mechanism, for applying an electromagnetic pressure on the junction surface of the liquid phase at the level of the interface comprising at least one spiral surrounding the crucible, and placed opposite to the area in which the interface forms in operation.

4 Claims, 2 Drawing Sheets

METHOD AND DEVICE FOR PRODUCTING MONOCRYSTALS

CLAIM FOR PRIORITY

This application is the national stage application under 35 U.S.C. § 371 of the International Application No. PCT/FR2005/050055 and claims the benefit of French Application No. 04/50177, filed Jan. 30, 2004 and Int'l Application No. PCT/FR2005/050055, filed Jan. 28, 2005, the entire disclosures of which are incorporated herein by reference in their entireties.

BACKGROUND OF THE INVENTION

1. Field of the Invention

The present invention relates to a method and a device for manufacturing single crystals by solidification of a liquid placed in the presence of a single-crystal solid.

2. Discussion of the Related Art

An application of the present invention relates to a device for manufacturing single crystals comprising a crucible in which are placed a seed of the single crystal to be formed and a liquid phase of the crystal. The liquid is progressively cooled down from the region close to the seed. The liquid first solidifies close to the seed, then the liquid-solid interface displaces inside of the crucible until the solidification is total. Since the newly-formed solid reproduces the crystal structure of the previously-formed adjacent solid, the seed imposes from close to close its crystal structure to the entire content of the crucible.

A problem of such a method is however linked to the differences in thermal expansion between the crucible and the crystal that it contains. Indeed, if the crucible contracts more than the crystal during the cooling, the single crystal risks being damaged or even fractured. It is then further difficult to extract the single crystal from the crucible, which must generally be destroyed. If the crystal contracts more than the crucible, the crystal does not necessarily remain intact either since it generally tends to adhere to the crucible after the solidification, and thus risks undergoing tensile stress on cooling.

FIG. 1 schematically shows a device for manufacturing single crystals which does not exhibit the previously-mentioned disadvantage. The device comprises a cylindrical crucible 1 containing a single-crystal solid phase 2 at its lower portion and a liquid phase 3 to be solidified above an interface 4 with solid phase 2. Liquid phase 3 bathes the wall of crucible 1, while solid phase 2 is separated from the wall of crucible 1 by an interstice 5. An upper duct 6 emerges into crucible 1 above the free surface of liquid phase 3, and a lower duct 7 also emerges into crucible 1, at the level of interstice 5. Ducts 6 and 7 join at the level of a system 8 capable of creating a differential pressure so that the pressure injected into lower duct 7 is greater than that of upper duct 6 by a value substantially equal to the hydrostatic pressure of liquid phase 3, that is, to the pressure generated by the height of liquid column 3. Interstice 5 spontaneously appears in such conditions when the crystal solidifies, interface 4 connecting to the wall of crucible 1 by a meniscus 10 above interstice 5. Such an example of a device for manufacturing single crystals is described in French patent application 2757184 filed by the Commissariat à l'Energie Atomique.

FIG. 2 shows a partial cut-away view of a variation of the single crystal manufacturing device of FIG. 1 in which crucible 11 is formed of a tightly-sealed tube placed on a support 12. A single-crystal solid phase 13 is attached to support 12 in crucible 11 and is covered with a liquid phase 14. A first furnace 15 surrounds crucible 11 substantially opposite to liquid phase 14. A second furnace 16 surrounds crucible 11 substantially opposite to solid phase 13. First and second furnaces 15, 16 impose a local temperature gradient in crucible 11 causing the solidification of liquid phase 14 at the level of the liquid-solid interface. Along the solidification of liquid phase 14, tight crucible 11 is displaced by motion of support 12 so that the liquid-solid interface is substantially fixed with respect to first and second furnaces 15, 16 and permanently is at the level of the temperature gradient. An interstice 17 exists between solid phase 13 and crucible 11. Liquid phase 14 connects solid phase 13 to crucible 11 by a meniscus 18. Interstice 17 is filled with a neutral gas which maintains meniscus 18. The pressure of the neutral gas is set via a third furnace 19 which heats up the lower portion of crucible 11. Such an example of a single crystal manufacturing device is described in French patent application 2806100 filed by the Commissariat à l'Energie Atomique.

The previously-described single crystal manufacturing devices enable avoiding the contact between the crucible and the single crystal. However, the use of such devices is difficult. Indeed, the difference between the pressures applied on meniscus 10, 18, and on the free surface of the liquid phase must decrease along the crystal growth since the height of liquid column 3, 14, and thus the resulting hydrostatic pressure, decreases. Further, the component(s) forming liquid phase 3, 14 have vapor tensions that may be high. This may translate as non-negligible gas exchanges between liquid phase 3, 14 and the environing gas, at the level of meniscus 10, 18 and at the level of the free surface of liquid phase 3, 14. Such exchanges complicate the control of the single crystal manufacturing method since they tend to modify the difference between the pressures applied on meniscus 10, 18 and on the free surface of liquid phase 3, 14. Further, for a single crystal comprising several components, such gas exchanges tend to modify the proportion of the components in liquid phase 3, 14. The obtained single crystal can then not have the desired composition. It is thus necessary to take into account the vapor tensions of the components of liquid phase 3, 14 to determine the pressure difference to be applied, which appears to be very delicate in practice, or even contrary to the obtaining of interstice 5.

SUMMARY OF THE INVENTION

The present invention aims at obtaining a device for manufacturing single crystals by solidification of a liquid put in the presence of a single-crystal seed which does not exhibit the previously-mentioned disadvantages.

To achieve this object, the invention provides a device for manufacturing a single-crystal solid phase by solidification of a liquid phase, comprising a crucible capable of containing the solid phase and having at least a wall capable of being in contact with the liquid phase, the liquid phase the crucible and the solid phase being separated from the crucible by an interstice; means for heating the liquid phase capable of creating a thermal gradient at the level of an interface between the liquid phase and the solid phase; and electromagnetic field generation means, distinct from the heating means, for applying an electromagnetic pressure on the junction surface of the liquid phase at the level of said interface comprising at least one spiral surrounding the crucible, and placed opposite to the area in which said interface forms in operation.

According to an embodiment of the invention, the crucible is capable of containing the liquid phase arranged above the solid phase, the device further comprising means for applying a first gas pressure on the junction surface and a second gas pressure on a free surface of the liquid phase opposite to the solid phase, the first gas pressure being greater than the second gas pressure.

The present invention also provides a method for manufacturing a single-crystal solid phase by solidification of a liquid phase comprising the steps of providing a crucible containing the solid phase and the liquid phase, the liquid phase being in contact with the crucible, the solid phase being separated from the crucible by an interstice; applying a thermal gradient at the level of an interface between the liquid phase and the solid phase; and simultaneously applying an electromagnetic pressure over the entire junction surface of the liquid phase at the level of said interface.

According to an embodiment of the invention, the liquid phase is located above the solid phase and consisting of applying a first gas pressure on the junction surface and a second gas pressure on a free surface of the liquid phase opposite to the solid phase, the first gas pressure being greater than the second gas pressure.

The foregoing object, features, and advantages, as well as others, of the present invention will be discussed in detail in the following non-limiting description of specific embodiments in connection with the accompanying drawings, among which:

DETAILED DESCRIPTION

Figure 1:
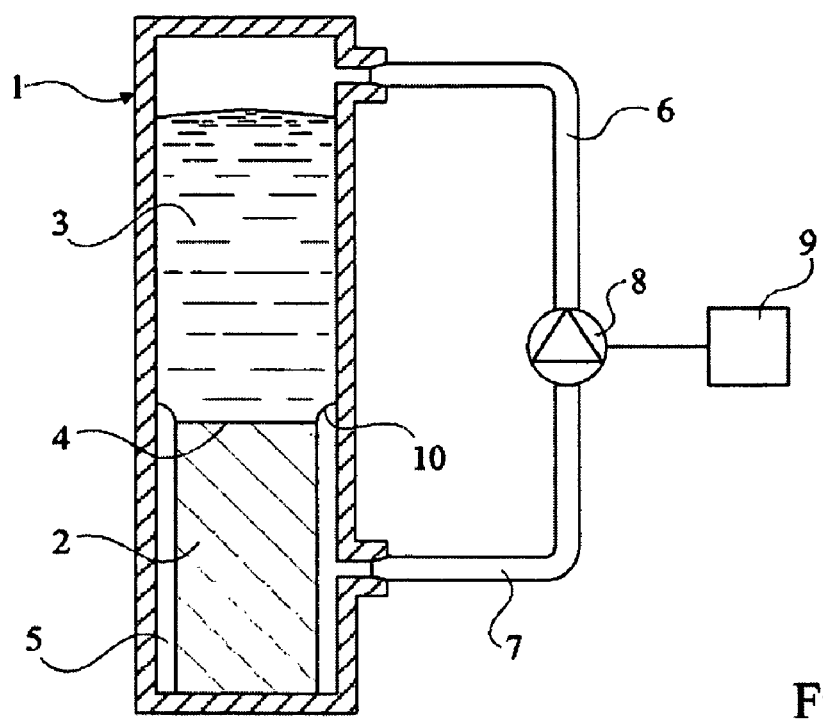
FIG. 1, previously described, schematically shows a conventional device for manufacturing single crystals.
Figure 2:
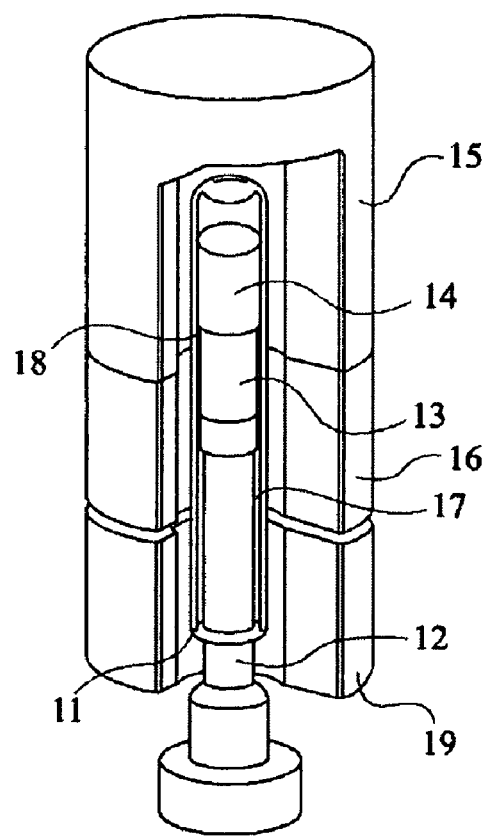
FIG. 2, previously described, schematically shows a variation of the device of FIG. 1.

An exemplary embodiment of the present invention will be described for a single crystal manufacturing device similar to those shown in FIGS. 1 and 2. Such a single crystal manufacturing device especially enables obtaining semiconductor single crystals of families II-VI (cadmium telluride crystal CdTe) and III-V -gallium arsenide crystal GaAs, indium phosphide crystal InP, gallium antimony crystal GaSb, indium antimony crystal InSb, etc.).

Figure 3:
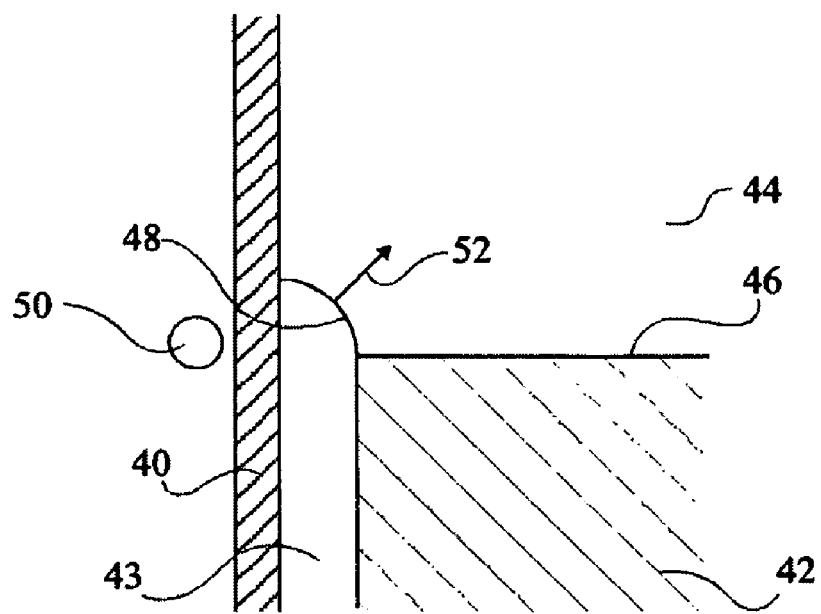
FIG. 3 schematically shows an example of the forming of the single crystal manufacturing device according to the present invention.

FIG. 3 shows a crucible 40 containing a solid single-crystal phase 42, separated from crucible 40 by an interstice 43, and topped, according to the vertical direction, with a liquid phase 44 from which is formed the single crystal. Liquid phase 44 is in contact with solid phase 42 at the level of a liquid-solid interface 46, and bathes crucible 40. At the level of interstice 43, liquid phase 44 is delimited by a meniscus 48 which extends between liquid-solid interface 46 and crucible 40.

A spiral 50 of circular cross-section, arranged outside of crucible 40, surrounds crucible 40 opposite to liquid-solid interface 46. Spiral 50 is crossed by an A.C. current which induces an electromagnetic field, especially at the level of meniscus 48, which translates as the application of an electromagnetic pressure on meniscus 48. As an example, the direction of the electromagnetic pressure applied at the level of the median portion of meniscus 48 is indicated by an arrow 52 in FIG. 4. The electromagnetic pressure is substantially on the order of $B^2/2\mu$, where B is the average amplitude of the electromagnetic field at the level of meniscus 48 and $\mu$ is the magnetic permeability of liquid phase 44. The applicant has shown that when spiral 50 is crossed by a 1,000-ampere alternating current at 50,000 hertz, the electromagnetic pressure applied on liquid phase 44 is sufficient to form meniscus 48 in an interstice 43 having a thickness of a few tens of microamperes and for a hydrostatic pressure of liquid column 44 corresponding to some ten centimeters of melted semiconductor even in the absence of a difference between the gas pressures applied on meniscus 48 and on the free surface of liquid phase 44. This is particularly advantageous in the case where it is desirable to form the single crystal in vacuum conditions.

When a difference between the pressures applied on meniscus 48 and the free surface of liquid phase 44 is imposed, an A.C. current having an amplitude much smaller than 1,000 amperes is sufficient to ensure the forming and the maintaining of meniscus 48. It may be desirable not to use electromagnetic fields of too high intensities to avoid too high a temperature rise and/or a hydrodynamic stirring of liquid phase 44, which may adversely affect the obtaining of a fine-quality single crystal. It may thus be preferably to use a method simultaneously implementing a gas pressure difference as for the devices shown in FIGS. 1 and 2, and the generation of a local electromagnetic field at the level of meniscus 48. The amplitude of the gas pressure difference and the amplitude of the electromagnetic field present at the level of meniscus 48 are especially determined according to the desired specific shape of the meniscus. In particular, the regulation of the gas pressure difference is eased by the presence of the electromagnetic pressure which takes part in the forming and in the maintaining of meniscus 48.

Solid phase 42 may be displaced along the solidification of liquid phase 44 so that liquid-solid interface 46 remains substantially fixed with respect to crucible 40. Spiral 50 is then substantially fixed with respect to crucible 40 opposite to liquid-solid interface 46. Conversely, the means for heating solid phase 42 and liquid phase 44 may be mobile with respect to crucible 40, causing a displacement of liquid-solid interface 46 with respect to crucible 40 along the solidification of liquid phase 44. The device according to the present invention then comprises means, not shown, for displacing spiral 50 so that spiral 50 is permanently, with respect to crucible 40, at the level of liquid-solid interface 46.

Figure 4:
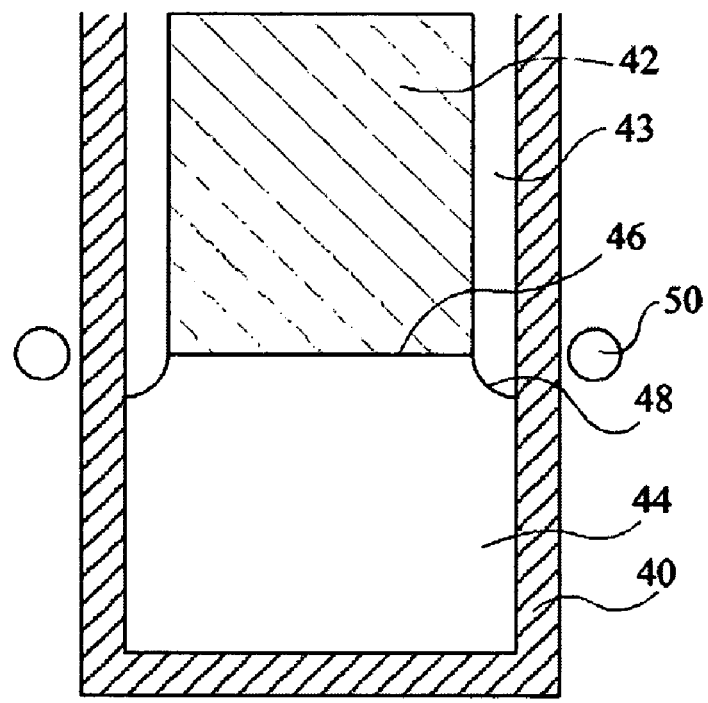
FIG. 4 schematically shows an alternative embodiment of the device of FIG. 3.

FIG. 4 shows an alternative embodiment of the single crystal manufacturing device of FIG. 3 in which liquid phase 44 is provided in crucible 40 under solid phase 42. Adapted means, not shown, then maintain solid phase 42 fixed with respect to crucible 40. Such a single crystal manufacturing device is generally called an inverse Bridgman growth device. In this case, meniscus 48 tends to form spontaneously, with no gas pressure. The electromagnetic field formed by spiral 50 enables stabilizing and controlling the shape of meniscus 48.

In the previously-described exemplary embodiments, the used spiral is of circular cross-section. The spiral cross-section may however be modified according to the electromagnetic field which is desired to be obtained. As an example, the spiral may have a "pointy" cross-section, the point being oriented towards the surface of the liquid phase on which an electromagnetic pressure is desired to be applied. Such a cross-section favors the increase of the average amplitude of the electromagnetic field at the level of the surface of the liquid phase on which the electromagnetic pressure is desired to be applied.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method for manufacturing a single-crystal solid phase by solidification of a liquid phase comprising the steps of:
   providing a crucible containing the solid phase and the liquid phase, the liquid phase being in contact with the crucible, the solid phase being separated from the crucible by an interstice;
   applying a thermal gradient at the level of an interface between the liquid phase and the solid phase; and
   simultaneously applying an electromagnetic pressure over the entire junction surface of the liquid phase at the level of said interface.

2. The method of claim 1, wherein the liquid phase is located above the solid phase and consisting of applying a first gas pressure on the junction surface and a second gas pressure on a free surface of the liquid phase opposite to the solid phase, the first gas pressure being greater than the second gas pressure.

3. A device for manufacturing a single-crystal solid phase by solidification of a liquid phase, comprising:
   a crucible capable of containing the solid phase and the liquid phase, the liquid phase being in contact with the crucible and the solid phase being separated from the crucible by an interstice; and
   means for heating the liquid phase capable of creating a thermal gradient at the level of an interface between the liquid phase and the solid phase,
   electromagnetic field generation means, distinct from the heating means, for applying an electromagnetic pressure on the junction surface of the liquid phase at the level of said interface comprising at least one spiral surrounding the crucible, and placed opposite to the area in which said interface forms in operation.

4. The device of claim 3, in which the crucible is capable of containing the liquid phase arranged above the solid phase, the device further comprising means for applying a first gas pressure on the junction surface and a second gas pressure on a free surface of the liquid phase opposite to the solid phase, the first gas pressure being greater than the second gas pressure.

* * * * *

UNITED STATES PATENT AND TRADEMARK OFFICE
CERTIFICATE OF CORRECTION

PATENT NO. : 7,465,355 B2  Page 1 of 1
APPLICATION NO. : 10/587368
DATED : December 16, 2008
INVENTOR(S) : Thierry Duffar and Annie Fournier-Gagnoud It is certified that error appears in the above-identified patent and that said Letters Patent is hereby corrected as shown below:

Title Page;
Section (54), line 1, change "Producting" to --Producing--.
Section (75), line 2, change "Grenoble" to --St. Ismier--.
Section (86), line 1, change "PCT/US2005/050055" to --PCT/FR2005/050055--.

Signed and Sealed this

Seventeenth Day of February, 2009

JOHN DOLL
*Acting Director of the United States Patent and Trademark Office*